(12) United States Patent
Scheele et al.

(10) Patent No.: US 10,828,917 B2
(45) Date of Patent: Nov. 10, 2020

(54) SYSTEM AND PROCESS FOR MOUNTING A PRINTING PLATE ON A CARRIER

(71) Applicant: ESKO-GRAPHICS IMAGING GMBH, Itzehoe (DE)

(72) Inventors: Joachim Scheele, Oldendorf (DE); Nils Kay, Oldendorf (DE); Jan Buchweitz, Huje (DE); Pascal Thomas, Hamburg (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 0 days.

(21) Appl. No.: 16/319,108

(22) PCT Filed: Jul. 20, 2017

(86) PCT No.: PCT/EP2017/068385
§ 371 (c)(1),
(2) Date: Jan. 18, 2019

(87) PCT Pub. No.: WO2018/015500
PCT Pub. Date: Jan. 25, 2018

(65) Prior Publication Data
US 2020/0164666 A1    May 28, 2020

Related U.S. Application Data

(60) Provisional application No. 62/365,041, filed on Jul. 21, 2016.

(51) Int. Cl.
*B41J 11/66* (2006.01)
(52) U.S. Cl.
CPC .................... *B41J 11/663* (2013.01)
(58) Field of Classification Search
CPC .......... B41J 11/663; B41J 11/666; G03F 9/00; B41F 27/005
(Continued)

(56) References Cited

U.S. PATENT DOCUMENTS

| 6,954,291 B2 | 10/2005 | Klein et al. |
| 9,375,916 B2 * | 6/2016 | Thomas .................... G03F 9/00 |

(Continued)

FOREIGN PATENT DOCUMENTS

| EP | 0348908 A2 | 1/1990 |
| EP | 1559520 A2 | 8/2005 |
| WO | 9801792 A1 | 1/1998 |

OTHER PUBLICATIONS

International Preliminary Report on Patentability for International Application No. PCT/EP2017/068385, dated Jan. 22, 2019—10 pages.

(Continued)

*Primary Examiner* — An H Do
(74) *Attorney, Agent, or Firm* — RatnerPrestia (57) ABSTRACT

A process for mounting a printing plate on a carrier sheet, including disposing registration indicia on the plate, placing the carrier sheet on a cutting table of a cutting system, mounting the plate to the carrier sheet, detecting absolute coordinates of the registration indicia; and cutting the carrier sheet along a cut line having absolute coordinates generated based upon the detected absolute coordinates. A related system includes the cutting system with the cutting table, a camera for detecting the registration indicia, a processor, a cutter, a controller, and a computer memory programmed with instructions for instructing the controller to detect the indicia, calculate the absolute coordinates for the cut line based upon the detected absolute coordinates and stored relative coordinates for the cut line, and cutting the carrier sheet along the cut line. Computer readable media containing such programmed instructions is also disclosed.

17 Claims, 6 Drawing Sheets

(58) Field of Classification Search
USPC .......................................... 347/16, 101, 104
See application file for complete search history.

(56) References Cited

U.S. PATENT DOCUMENTS

| | | |
|---|---|---|
| 2004/0083862 A1 | 5/2004 | Mikkelsen et al. |
| 2011/0308411 A1 | 12/2011 | Thomas et al. |
| 2014/0115886 A1 | 5/2014 | Sevigny |

OTHER PUBLICATIONS

International Search Report and Written Opinion for International Application No. PCT/EP2017/068385, dated Nov. 24, 2017—11 pages.
PlatePatcher 14.0 User Manual dated Jul. 9, 2014—48 pages.
PlatePatcher 14.1 User Manual dated Apr. 28, 2016—48 pages.

* cited by examiner

SYSTEM AND PROCESS FOR MOUNTING A PRINTING PLATE ON A CARRIER

CROSS REFERENCE TO RELATED APPLICATIONS

This application is a national phase submission under 35 U.S.C. § 371 of PCT Application Ser. No. PCT/EP2017/068385, titled SYSTEM AND PROCESS FOR MOUNTING A PRINTING PLATE ON A CARRIER, filed 20 Jul. 2017, which claims priority from U.S. Provisional Application No. 62/365,041, titled PROCESS FOR MOUNTING A PRINTING PLATE ON A CARRIER, filed on 21 Jul. 2016, the contents of both of which are incorporated herein by reference in their entirety for all purposes.

BACKGROUND OF THE INVENTION

In commercial printing, the occasion arises where it is desired to mount a relatively smaller printing plate on a relatively larger carrier sheet, such as for using the plate on a press. U.S. Pat. App. Ser. No. 20110308411 ("the '411 Publication), owned by the assignee of the present invention and incorporated herein by reference, describes a process for creating one or more imaged segments from a full size printing plate sheet, marking each segment with non-printing registration marks, and mounting the segments onto a mounting material using the registration marks for alignment.

U.S. Pat. No. 6,954,291, also owned by the assignee of the present invention and incorporated herein by reference, describes a plurality of plate "patches" having a size less than a full size plate that may be disposed on a single carrier having a size of the full size plate to save on printing plate material costs. The process for mounting each patch comprises printing indicia, such as corner marks, on the carrier sheet to mark where each patch should be affixed. The workflow for creating such patching is well established, such as using Esko's PlatePatcher™ module that is offered as a part of its Digital Flexo Suite. PlatePatcher analyses large bitmap files to create small plate slugs with printing information. The mounting locations are then sent to the Kongsberg (Plot & Cut workflow) software for marking the corner marks for mounting the plate on the carrier sheet. The carrier sheet may then be cut to a desired size after the plate has been mounted.

In certain workflows, however, such as those that require mounting a large (e.g. greater than 1 meters in dimension on one or more sides) plate on a carrier sheet, the workflow as described above, comprising creating registration marks on the plate, using those registration marks to align the plate on the carrier relative to marks on the carrier, then cutting the carrier, may result in significant misregistration if the plate is not precisely aligned on the carrier prior to cutting, thereby causing unacceptable defects in the print job. Additionally, achieving precise alignment may be very difficult for relatively large plates. Accordingly, a superior workflow is needed.

SUMMARY OF THE INVENTION

One aspect of the invention comprises a process for mounting a printing plate having a first periphery on a carrier sheet having a second periphery that surrounds the first periphery. The process comprising the sequential steps of first, providing registration indicia—typically a plurality of at least two registration marks—on the printing plate, then placing a carrier sheet on a cutting table of a cutting system, mounting the printing plate to the carrier sheet, and detecting with the cutting system absolute coordinates of the registration marks on the printing plate. The carrier sheet is then cut along a cut line having absolute coordinates generated based upon the detected absolute coordinates of the one or more printing plate registration marks. A cut file associated with the printing plate may be generated, and an identifier of the file provided on the printing plate. The cut file comprises a plurality of machine readable instructions for controlling the cutting system for carrying out the steps of detecting the registration marks and cutting the carrier sheet based upon those marks, including relative coordinates for location of the cut line based upon relative coordinates of the printing plate registration marks.

In one embodiment, the process may include the step of, after placing the carrier sheet on the cutting table, disposing on the carrier sheet a plurality of corner indicia marking approximate corners of the carrier sheet to be cut. If inspection of the carrier sheet shows that one or more of the plurality of corner indicia are disposed outside of the carrier sheet, placement of the carrier sheet is adjusted and the corner indicia are regenerated. Then, after the carrier sheet is confirmed to be properly placed, the process comprises disposing on the carrier sheet plate mounting indicia marking an approximate location and orientation for mounting the printing plate. The cut file may include corresponding instructions for performing the foregoing steps of this embodiment, as well as absolute coordinates for location of the corner and plate mounting indicia to be marked on the carrier sheet.

Aspects of the invention include the processes described herein, systems comprising processor memories programmed with instructions for performing the processes described herein, and computer readable media containing the instructions for performing the processes described herein

DETAILED DESCRIPTION OF THE INVENTION

Figure 2:
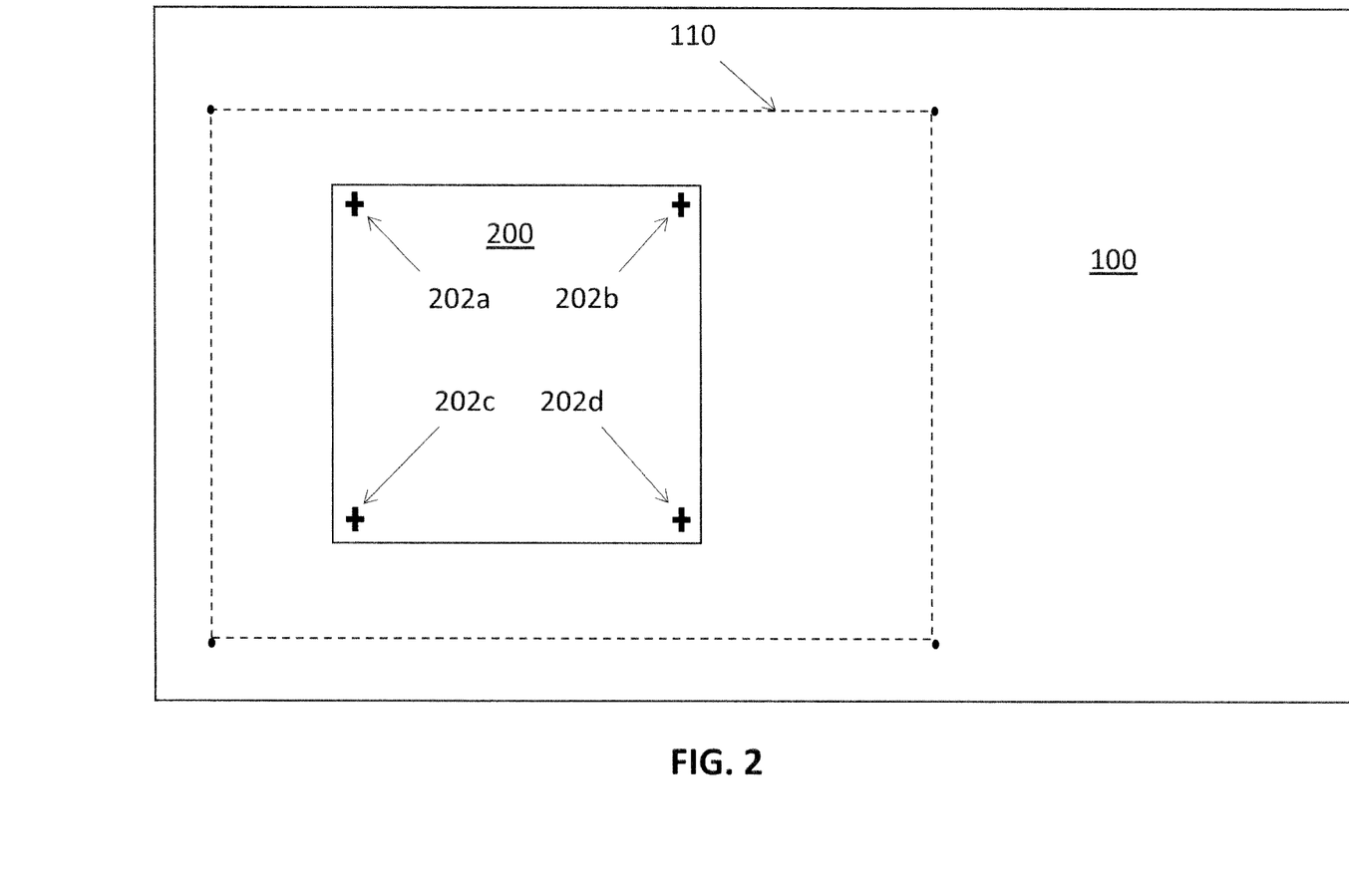
FIG. 2 illustrates an exemplary carrier sheet and mounted printing plate in accordance with one aspect of the invention.
Figure 5:
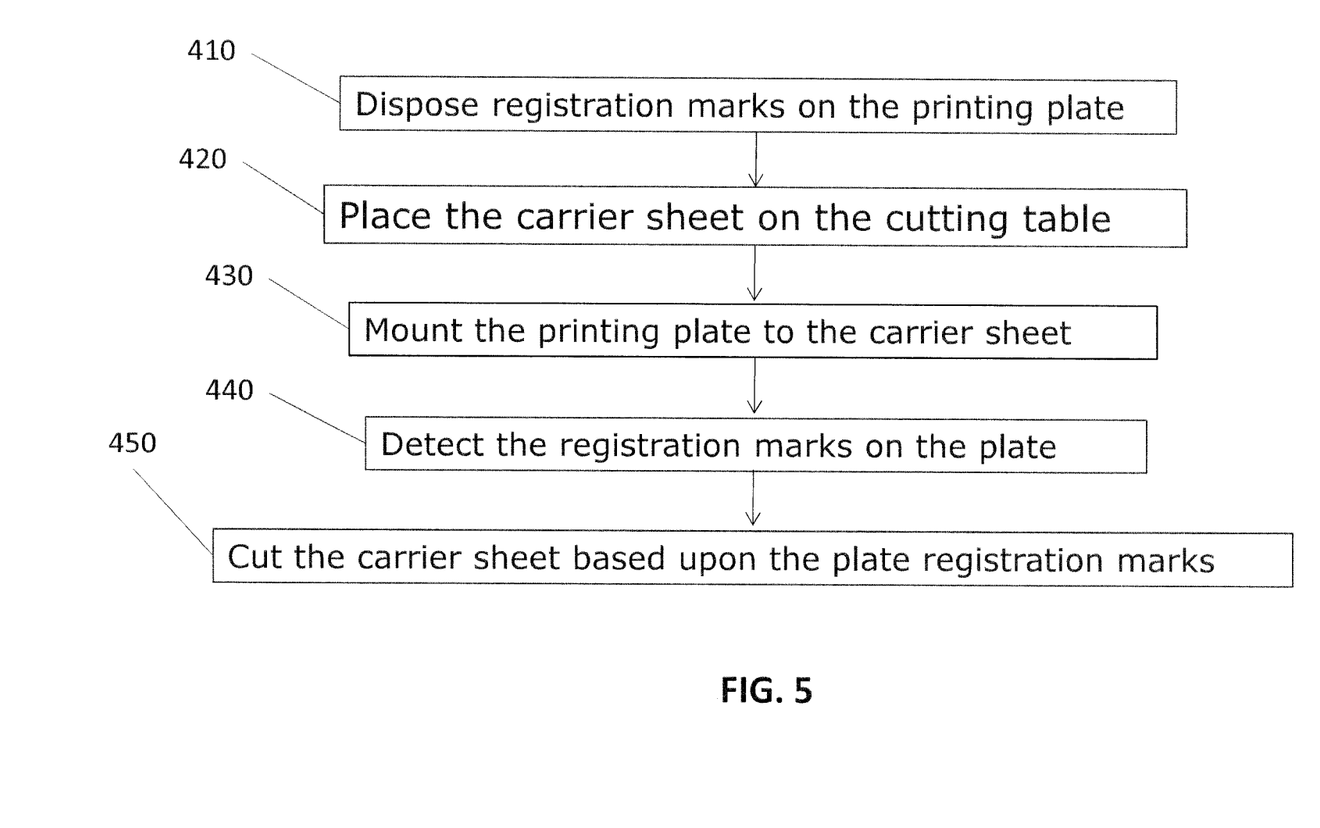
FIG. 5 is a flowchart depicting an exemplary workflow corresponding to one aspect of the invention.

Referring now to the figures, FIG. 2 illustrates the arrangement of the plate and the carrier sheet in a first embodiment of the invention in accordance with the flowchart of FIG. 5, depicting a first exemplary process workflow. Printing plate 200 has a periphery that is surrounded by the periphery of carrier sheet 100. In an exemplary workflow, in step 410, indicia, namely a plurality of registration marks 202a-202d, comprising at least two registration marks, such as marks 202a and 202c, are disposed on the printing plate. These registrations marks are detectable by a camera (not shown) of a cutting table, such as a Kongsberg cutting table, from Esko-Imaging Graphics GmbH of Itzehoe, Germany. Although depicted as visible cross marks in FIG. 2, the registration marks may have any characteristics suitable for detection. Although not limited to any particular type of indicia or process for making them on a plate, U.S. Pat. No. 6,954,291, referenced above, describes an exemplary process for marking printing plates with exemplary registration marks.

Carrier sheet 100 is then placed on a cutting table of a cutting system (not shown) in step 420, and printing plate 200 is mounted to the carrier sheet (such as with adhesive or any means for fixation known in the art) in step 430. The camera of the cutting system then detects the coordinates of the registration marks on the plate in step 440, a processor connected to the camera and the cutting system automatically determines the coordinates for the cut line based upon the coordinates of the registration marks, and then, in step 450, the cutting system cuts the carrier sheet along cut line 110 based upon the detected absolute coordinates of the plate registration marks, which define the location and orientation of the printing plate. Thus, in contrast to the prior art process, in which the cutting system prints indicia for alignment of the plate on the carrier, and then performs the cutting step based upon an expected location of the plate, under the assumption that the plate has been sufficiently well aligned relative to those corner marks, the process described herein cuts the edges of the carrier sheet based upon the actual detected orientation of the plate as detected by the location of the registration marks on the plate, thereby ensuring perfect alignment between the image features on the plate and the edges of the carrier sheet.

Figure 4:
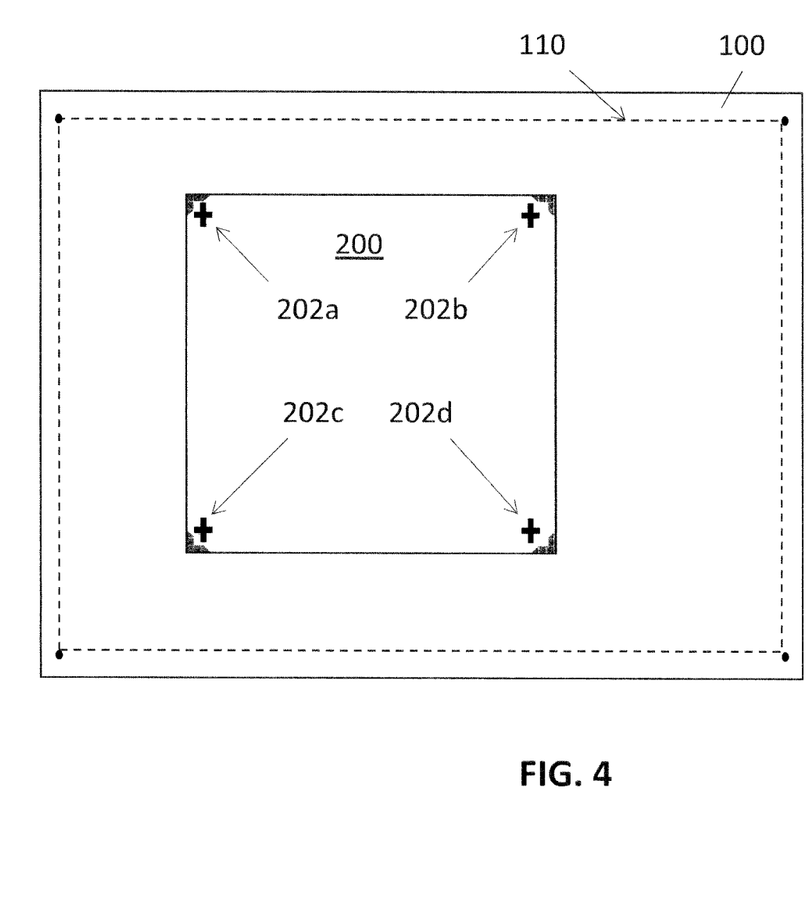
FIG. 4 illustrates the exemplary carrier sheet of FIG. 3 with the printing plate mounted thereon.

Although shown with four registration marks in FIGS. 2 and 4, it should be understood that various registration systems are known, and that anywhere from two to four registration marks are typically used. As is known in the art, a registration mark having certain characteristics (such as a cross shape) may enhance detection of location and orientation of each mark. The invention is not limited to any particular number or shape of plate registration marks. As used herein, the term "registration indicia" may refer to a single mark or any number of marks.

In the aforementioned process, a cut file is generated and uniquely named that comprises a plurality of machine readable instructions for controlling the cutting system for carrying out the process. The cut file is typically generated at approximately the same time as the plate is marked with the indicia, but may be created before or afterwards, and contains the coordinates for locating the cut line relative to the locations of the printed registration indicia on the plate. The cut file is then associated with the printing plate, such as for example, by marking the plate with the unique name for the cut file and saving the cut file by the name in computer memory. After the printing plate has been mounted on the carrier sheet, the cut file is retrieved from memory and activated, and the instructions are carried out by the cutting system to detect the registration marks, generate the absolute coordinates for the cut line based upon the detected absolute coordinates of the printing plate registration marks and the relative coordinates in the cut file, and then cut the carrier sheet along those coordinates.

Figure 3:
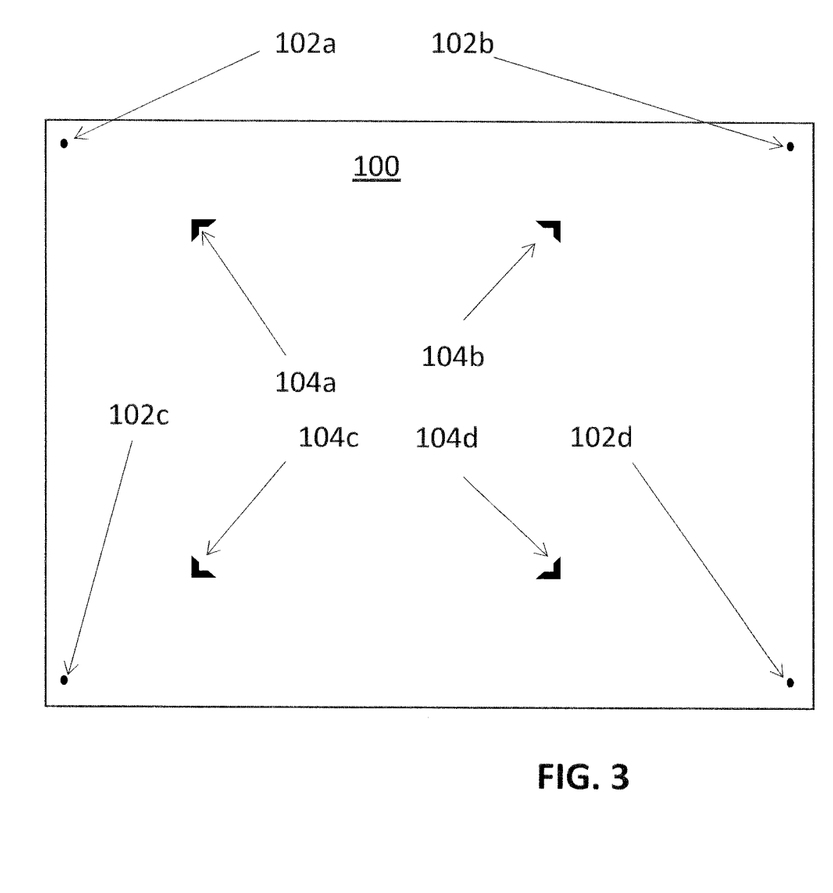
FIG. 3 illustrates an exemplary carrier sheet prior to mounting a printing plate in accordance with another aspect of the invention.

The process described above may be perfectly suited for a workflow in which the distances between the cut line and the periphery of the uncut carrier sheet and between the periphery of the plate and the periphery of the uncut carrier sheet are relatively large, such that misalignment of the carrier sheet on the cutting table and/or misplacement or misalignment of the plate on the carrier sheet relative to expected locations does not risk the cut line falling outside the periphery of the carrier sheet. A more foolproof embodiment, however, may be preferred for certain jobs, such as those in which the aforementioned distances are not so large, and misalignment of the carrier sheet on the cutting table would indeed risk the cut line falling outside the periphery of the carrier sheet. As this more foolproof embodiment contains additional steps, which will require more time per work piece, workflows may be tailored with or without these additional steps based on the commercial realities of the job being implemented. Referring now to FIGS. 3 and 4 in accordance with the flowchart of FIG. 6, a second exemplary process workflow is illustrated conforming to this more foolproof embodiment.

Figure 6:
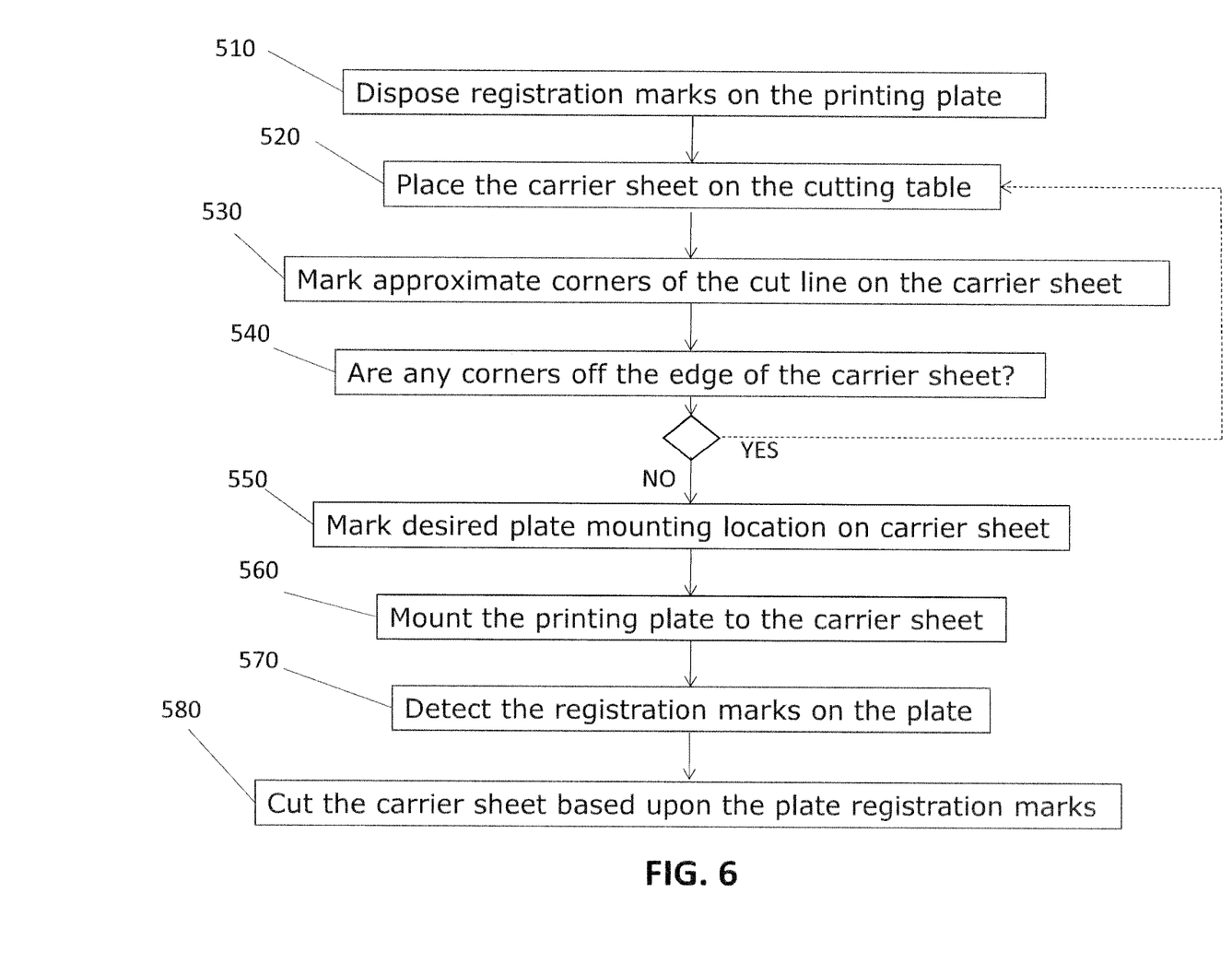
FIG. 6 is a flowchart depicting an exemplary workflow corresponding to another aspect of the invention.

In the second exemplary process, after disposing the plurality of registration marks 202a-202d on the printing plate in step 510 and placing the carrier sheet on the cutting table in step 520, the cutting system, in accordance with step 530, places on the carrier sheet corner indicia 102a-d marking the approximate corners of the expected cut line based upon an expected location for placement of the printing plate. In step 540, the carrier sheet is inspected to determine whether performing step 530 has resulted in one or more of the approximate corner indicia disposed outside of the carrier sheet, and if so, the is workflow reverts to step 520, the orientation of the carrier sheet is adjusted, and step 530 is repeated. Although shown as small dots 102a-d, the corner indicia may have any shape or size. The carrier sheet is inspected again in step 540, and the workflow is not advanced until performance of steps 520 and 530 results in all of the approximate corner indicia disposed on the carrier sheet. Then, in step 550, the cutting system marks the carrier sheet with plate mounting indicia 104a-d identifying an approximate location and orientation for mounting the printing plate. Although shown as four corner marks (short lines abutting at a 90 degree angle, each oriented to align with the edges of the placed printing plate), the indicia may take on any shape, size, and number. For example, the indicia may comprise a single marking comprising the full outline of the plate to be mounted.

In step 560, the printing plate is mounted in approximate alignment with the plate mounting indicia on the carrier sheet, as shown in FIG. 4, and in step 570, the camera detects the absolute coordinates of the registration marks 202a-d on the plate. In step 580, after processing the absolute coordinates of the registration marks as detected to determine the absolute coordinates of the cut line, the cutting system cuts the carrier sheet along the cut line 110. A suitable cut file may also contain the instructions for carrying out the steps of this embodiment, including for marking the carrier sheet as described above, and also contains the relative coordinates for the cut line based upon the relative coordinates of the registration marks, as well as absolute coordinates for the four approximate corner marks and for the indicia for approximately aligning the plate on the carrier sheet.

In operation, the carrier sheet is placed on the cutting table, the cut file identifier (read from the printing plate) is entered in the cutting system, the cut file is located and activated, and instructions from the cut file are processed by a processor associated with the cutting system. If the cut file includes instructions for marking the carrier sheet, the four corner indicia are marked, and the system waits for confirmation that the corners are disposed on the plate before advancing to the next set of instructions in the file. If the markings are not all disposed on the carrier sheet, the sheet is repositioned, and the corner marking instructions are re-run. Then the indicia for approximately aligning the plate are printed, and the system waits for confirmation that the plate has been mounted before advancing to the next set of instructions. Upon receipt of that confirmation, the system then locates the registration marks and cuts the carrier sheet based upon the location and orientation of the registration marks. In a typical operation, a human operator may perform the steps of placing the carrier sheet on the cutting table, reading and entering the cut file name into the cutting system, checking to ensure the four corner indicia appear on the carrier sheet, and mounting the plate to the carrier sheet, and may provide a signal to the cutting system when each of these steps has been performed, to permit the system workflow to move to the next set of programmed instructions (or to revert back to a prior step, if necessary). It should be understood, however, that each of these steps may be made fully automatic or partially automatic, and that the human operator may rely on various machines and equipment known in the art to provide assistance in performing each step.

Cutting systems, including the computer systems associated therewith, including processors, memory, and various physical and virtual connections between them to permit communication between the various parts of the system, are well known in the art, as are workflow for making printing plates and mounting them on carrier sheets. Accordingly, many of the details that will be well known to those of skill in the art are not repeated here, but exemplary embodiments of such workflows and systems are specifically incorporated by reference via the patents mentioned above. Aspects of the invention include systems comprising processor memories programmed with instructions for performing the processes described herein, as well as computer readable media containing such instructions.

Figure 1:
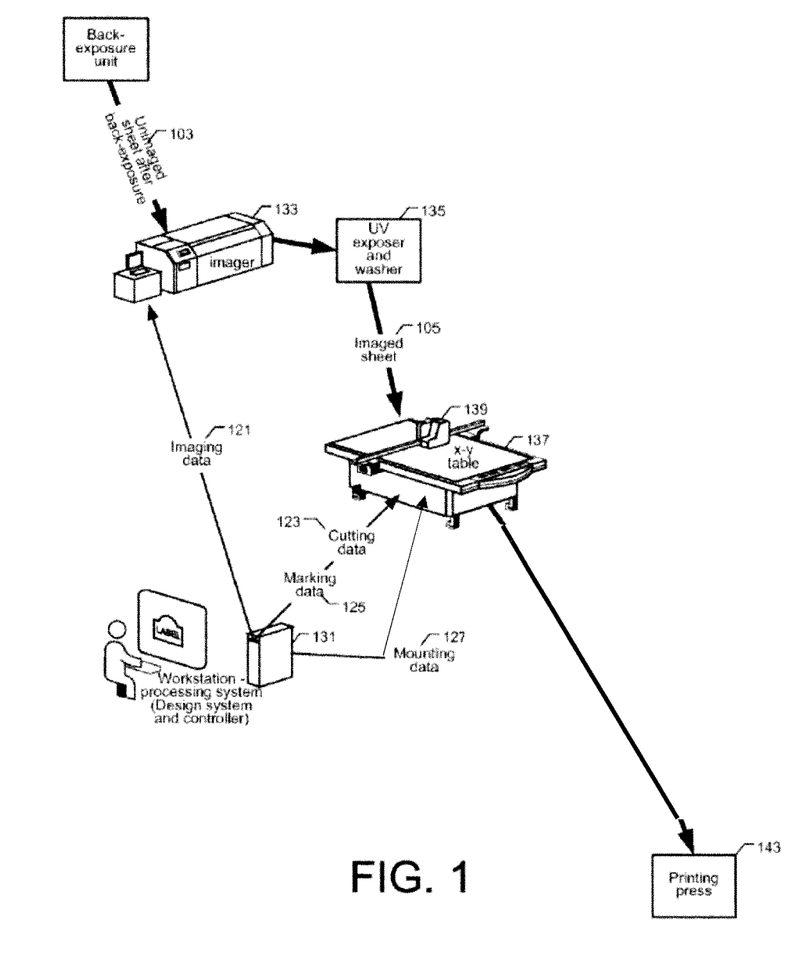
FIG. 1 illustrates an exemplary plate making and cutting table system and its workflow in accordance with one embodiment of the invention.

FIG. 1 depicts an exemplary workflow relevant to the present invention. Imager 133 may be configured for direct-to-plate printing on sheets that have an ablatable mask material thereon. In the case of non-direct-to-plate imaging, the imager exposes a mask, e.g., a photographic mask. The workflow also includes a UV exposer and washer 135 that is used to cure the sheet with a mask thereon by exposing the front of the plate with the mask thereon to UV radiation. In the case of direct-to-plate imaging, the sheet of plate material (after back-radiation) is imaged on the imager. In the case of non-direct-to-plate imaging, the UV exposer and washer 135 includes a mechanism to place a mask on the front of the plate prior to exposure, and it is the mask that comes from the imager and placed with the sheet of plate material after back-exposure.

An exemplary cutting system includes a cutting table 137, such as but not limited to an Esko Kongsberg-Table (X-Table), which typically includes a tool holder 139 and is operably controlled according to x-y control data. In some embodiments, the x-y table can operate one of a set of tools in the tool holder 139 under control of the x-y control data, including selecting a tool of the set. As an example, one tool of the set may be a cutting tool, such as a milling spindle or a knife head, making the x-y table 137 operative to cut segments from a sheet placed on the table according to x-y control data that includes the cutting data 123. The x-y table 137 may include a laser positioning tool and in some embodiments, one or more video cameras. The positioning tool and/or the video cameras or both are used to accurately register the position of a sheet of plate material placed on the cutting table. The set of tools 139 may include a marking tool, which depending of the embodiment, can be laser tool, a knife tool, a drill tool, or a pen tool, that may be used for placing registration marks on a plate or carrier sheet placed on the table 137. In some embodiments, for example, the imaging data includes one or more registration marks on the printing plate that are exposed to produce visible registration marks on the plate. By registering to the registration marks on the plate, the imaging data 121 and any x-y control data, e.g., mounting data 127 for mounting a printing plate on a carrier sheet, marking data 125 for marking the carrier sheet with a marking tool, and cutting data 123 for cutting the carrier sheet with a cutting tool can all have the same frame of reference on the surface of the sheet when placed on the x-y table 137.

While FIG. 1 shows a controllable x-y table for cutting, any controllable cutting device can be used for cutting. After the printing plate has been mounted on the carrier sheet, it may then be used in a printing press 143 to make desired printed matter.

An exemplary system for mounting a printing plate in accordance with the process disclosed herein comprises at least a cutting system, such as that shown in FIG. 1, comprising a cutting table 137 for receiving a carrier sheet, a camera (not shown) operable to detect registration marks on a printing plate, a processor for processing coordinates of the detected registration marks and for calculating coordinates for cutting the carrier sheet based upon the detected registration mark coordinates, a cutter (e.g. a cutting tool placed in tool holder 139) for cutting the carrier sheet, and a controller for controlling the cutting system based upon programmed instructions. The cutting system also includes a computer memory, readable by a machine, and programmed with instructions for instructing the cutting system controller. The processor, controller, and memory are typically part of an integrated processing system that may have a workstation operated by a human user, such as workstation processing system 131 depicted in FIG. 1.

The programmed instructions may include at least programming for carrying out the following steps:

a. detecting with the cutting system camera absolute coordinates of one or more registration marks on the printing plate when mounted on the carrier sheet;

b. calculating absolute coordinates for the cut line based upon the detected absolute coordinates of the one or more printing plate registration marks in accordance with stored relative coordinates for location of the cut line based upon relative coordinates of the registration marks; and c. cutting the carrier sheet along the cut line.

The cutting system is also preferably integrated with a plate maker (e.g. imager 133) programmable to place the one or more registration marks on the printing plate, in which case the programmed instructions further comprise instructions for placing the one or more registration marks on the printing plate and for defining the relative coordinates for location of the cut line based upon relative coordinates of the registration marks. A typical cutting system also typically has means for placing indicia on the carrier sheet, such as any of the marking tools in tool set 139, described above. The marking means may also be an ink jet printer module operable to dispose ink in accordance with programmed instructions. Non-ink indicia may be created using cuts or scores or drill holes made by a cutting or drilling tool or by marks made by a laser, and the marking means may also be a pen (or pencil) tool, comprising a point or stylus that makes physical contact with the carrier sheet, and any and all means for creating marks on a carrier sheet known in the art equivalent to the foregoing. Thus, to carry out the embodiment described in FIG. 6, the system may also comprise programmed instructions for disposing on the carrier sheet a plurality of corner indicia marking approximate corners of the carrier sheet, and disposing on the carrier sheet plate mounting indicia marking an approximate location and orientation for mounting the printing plate.

Aspects of the invention also include computer readable media containing programmed instructions for controlling a cutting system to facilitate the processes disclosed herein, such as:

a. instructions for defining relative coordinates for location of a cut line on the carrier sheet based upon relative coordinates of one or more registration marks on the to printing plate;

b. instructions for detecting with the cutting system absolute coordinates of the one or more registration marks on the printing plate when mounted on the carrier sheet;

c. instructions for calculating absolute coordinates for the cut line based upon the detected absolute coordinates of the one or more printing plate registration marks and the relative coordinates for location of the cut line based upon the relative coordinates of the one or more printing plate registration marks; and d. instructions for causing the cutting system to cut the carrier sheet along the cut line.

The programmed instructions may also include instructions for disposing on the carrier sheet a plurality of corner indicia marking approximate corners of the carrier sheet, instructions for disposing on the carrier sheet plate mounting indicia marking an approximate location and orientation for mounting the printing plate, and instructions to cause a plate maker to place the registration marks on the printing plate. In an exemplary embodiment, the instructions for causing the plate maker to place the registration marks on the printing plate may comprise a module in the Esko PlatePatcher software that provides instructions for making a single, large plate with such registration marks (rather than multiple small plate pieces, as disclosed in the '291 patent and as heretofore delivered using the PlatePatcher software). The invention is not limited to any particular process for providing the registration marks on the printing plate, however.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A process for mounting a printing plate having a first periphery on a carrier sheet having a second periphery that surrounds the first periphery, the process comprising the sequential steps of:
   a. including registration indicia on the printing plate;
   b. placing the carrier sheet on a cutting table of a cutting system;
   c. mounting the printing plate to the carrier sheet;
   d. detecting with the cutting system absolute coordinates of the registration indicia on the printing plate; and
   e. cutting the carrier sheet along a cut line having absolute coordinates generated based upon the detected absolute coordinates of the printing plate registration indicia.

2. The process of claim 1, further comprising:
   prior to step b, saving in a system memory a cut file associated with the printing plate and providing on the printing plate an identifier corresponding to the cut file, the cut file comprising a plurality of machine readable instructions for controlling the cutting system for carrying out steps d and e, including relative coordinates for location of the cut line based upon relative coordinates of the printing plate registration indicia; and
   prior to step d, activating the cut file.

3. The process of claim 1, further comprising after step b and prior to step c, the step of:
   b1. disposing on the carrier sheet a plurality of corner indicia marking approximate corners of the carrier sheet to be cut in step e, and
   b2. disposing on the carrier sheet plate mounting indicia marking an approximate location and orientation for mounting the printing plate in step c.

4. The process of claim 3, further comprising checking whether one or more of the plurality of corner indicia placed in step b1 are disposed outside of the carrier sheet, and if so, repeating step b to adjust placement of the carrier sheet, then repeating step b1.

5. The process of claim 3, further comprising:
   prior to step b, saving in a system memory a cut file associated with the printing plate, the cut file comprising a plurality of machine readable instructions for controlling the cutting system for carrying out steps b1, b2, d and e, for providing an identifier corresponding to the cut file on the printing plate, and containing relative coordinates for location of the cut line based upon relative coordinates of the printing plate registration indicia and absolute coordinates for location of the corner and plate mounting indicia to be marked on the carrier sheet; and
   prior to step b1, activating the cut file.

6. The process of claim 1, wherein the registration indicia comprises a plurality of registration marks.

7. The process of claim 6, wherein the plurality of registration marks comprises two, three, or four registration marks.

8. A system for cutting a carrier sheet, the carrier sheet having a second periphery that surrounds a periphery of a printing plate having a first periphery and mounted on the carrier sheet, the system comprising:
   a cutting system comprising a cutting table for receiving the carrier sheet, a camera operable to detect registration indicia on the printing plate, a processor for processing coordinates of the detected registration indicia and for calculating coordinates for cutting the carrier sheet based upon the coordinates of the detected registration indicia, a cutter for cutting the carrier sheet, and a controller for controlling the cutting system based upon programmed instructions;
   a computer memory, readable by a machine, and programmed with instructions for instructing the cutting system controller to perform steps comprising:
      a. detecting with the cutting system camera absolute coordinates of registration indicia on the printing plate mounted on the carrier sheet;
      b. calculating absolute coordinates for the cut line based upon the detected absolute coordinates of the printing plate registration indicia in accordance with stored relative coordinates for location of the cut line based upon relative coordinates of the registration indicia; and
      c. cutting the carrier sheet along the cut line.

9. The system of claim 8, further comprising a plate maker programmable to place the registration indicia on the printing plate, wherein the programmed instructions further comprise instructions for placing the registration indicia on the printing plate and for defining the relative coordinates for location of the cut line based upon relative coordinates of the registration indicia.

10. The system of claim 8, wherein the cutting system further comprises means for placing indicia on the carrier sheet, and the programmed instructions further comprise instructions for disposing on the carrier sheet a plurality of corner indicia marking approximate corners of the carrier sheet, and disposing on the carrier sheet plate mounting indicia marking an approximate location and orientation for mounting the printing plate.

11. The system of claim 8, wherein the registration indicia comprises a plurality of registration marks.

12. The system of claim 11, wherein the plurality of registration marks comprises two, three, or four registration marks.

13. Computer readable media containing programmed instructions for controlling a cutting system to facilitate mounting a printing plate having a first periphery on a carrier sheet having a second periphery that surrounds the first periphery, the instructions comprising:

a. instructions for defining relative coordinates for location of a cut line on the carrier sheet based upon relative coordinates of the registration indicia on the printing plate;

b. instructions for detecting with the cutting system absolute coordinates of the registration indicia on the printing plate mounted on the carrier sheet;

c. instructions for calculating absolute coordinates for the cut line based upon the detected absolute coordinates of the printing plate registration indicia and the relative coordinates for location of the cut line based upon the relative coordinates of the printing plate registration indicia; and    d. instructions for causing the cutting system to cut the carrier sheet along the cut line.

14. The computer readable media of claim 13, further comprising programmed instructions for disposing on the carrier sheet a plurality of corner indicia marking approximate corners of the carrier sheet, and disposing on the carrier sheet plate mounting indicia marking an approximate location and orientation for mounting the printing plate.

15. The computer readable media of claim 13, further comprising programmed instructions for instructing a plate maker to place the registration indicia on the printing plate.

16. The computer readable media of claim 13, wherein the registration indicia comprises a plurality of registration marks.

17. The system of claim 16, wherein the plurality of registration marks comprises two, three, or four registration marks.

\* \* \* \* \*